(12) United States Patent
Wojcik et al.

(10) Patent No.: US 10,784,411 B2
(45) Date of Patent: Sep. 22, 2020

(54) HOUSING HAVING A RECESS EXTERIOR FOR AN OPTOELECTRONIC COMPONENT

(71) Applicant: OSRAM OLED GmbH, Regensburg (DE)

(72) Inventors: Andreas Wojcik, Regensburg (DE); Martin Haushalter, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 83 days.

(21) Appl. No.: 15/760,027

(22) PCT Filed: Sep. 15, 2016

(86) PCT No.: PCT/EP2016/071851
§ 371 (c)(1),
(2) Date: Mar. 14, 2018

(87) PCT Pub. No.: WO2017/046257
PCT Pub. Date: Mar. 23, 2017

(65) Prior Publication Data
US 2018/0261731 A1  Sep. 13, 2018

(30) Foreign Application Priority Data
Sep. 18, 2015 (DE) .................. 10 2015 115 824

(51) Int. Cl.
*H01L 33/00* (2010.01)
*H01L 31/0203* (2014.01)
(Continued)

(52) U.S. Cl.
CPC ............ *H01L 33/486* (2013.01); *H01L 21/56* (2013.01); *H01L 25/167* (2013.01); *H01L 33/00* (2013.01);
(Continued)

(58) Field of Classification Search
CPC ......... H01L 33/00; H01L 33/52; H01L 33/54; H01L 33/62; H01L 33/486; H01L 25/167;
(Continued)

(56) References Cited

U.S. PATENT DOCUMENTS 6,816,522 B2    11/2004  Nishiyama
7,838,357 B2 *  11/2010  Bogner ................. H01L 33/486
                                                  438/200
(Continued)

FOREIGN PATENT DOCUMENTS

CN        1438532 A      8/2003
CN      201739899 U      2/2011
(Continued)

OTHER PUBLICATIONS

Notice of Reasons for Rejection dated Feb. 5, 2019, of counterpart Japanese Application No. 2018-512196, in English.
(Continued)

*Primary Examiner* — Alonzo Chambliss
(74) *Attorney, Agent, or Firm* — DLA Piper LLP (US)

(57) ABSTRACT

An optoelectronic component includes an optoelectronic semiconductor chip that emits electromagnetic radiation, arranged in a housing, wherein the housing has an outer wall face and an exit face transparent to the electromagnetic radiation, the exit face is set back relative to the outer wall face in a direction of an interior of the housing, the optoelectronic semiconductor chip is arranged such that radiation emitted by the optoelectronic semiconductor chip in an emission direction can emerge from the optoelectronic component through the exit face, and the outer wall face has separating marks and the exit face is free of separating marks.

18 Claims, 3 Drawing Sheets

(51) Int. Cl.
*H01L 21/00* (2006.01)
*H01L 33/48* (2010.01)
*H01L 33/62* (2010.01)
*H01S 5/022* (2006.01)
*H01L 33/54* (2010.01)
*H01L 25/16* (2006.01)
*H01L 21/56* (2006.01)
*H01L 33/52* (2010.01)

(52) U.S. Cl.
CPC .............. *H01L 33/52* (2013.01); *H01L 33/54* (2013.01); *H01L 33/62* (2013.01); *H01S 5/02208* (2013.01); *H01S 5/02228* (2013.01); *H01S 5/02244* (2013.01); *H01S 5/02272* (2013.01); *H01S 5/02296* (2013.01); *H01L 2933/005* (2013.01); *H01L 2933/0033* (2013.01); *H01S 5/02216* (2013.01)

(58) Field of Classification Search
CPC . H01L 21/56; H01S 5/02208; H01S 5/02228; H01S 5/0224; H01S 5/02272; H01S 5/02296
See application file for complete search history.

(56) References Cited

U.S. PATENT DOCUMENTS

| | | | |
|---|---|---|---|
| 8,530,250 B2* | 9/2013 | Ichikawa | H01L 33/0095 438/26 |
| 9,190,553 B2* | 11/2015 | Luruthudass | H01L 31/12 |
| 9,379,517 B2 | 6/2016 | Wojcik et al. | |
| 2003/0209658 A1 | 11/2003 | Iguchi et al. | |
| 2006/0285565 A1 | 12/2006 | Chang et al. | |
| 2008/0265266 A1* | 10/2008 | Bogner | H01L 33/60 257/98 |
| 2009/0114937 A1* | 5/2009 | Kawakubo | H01L 33/642 257/98 |
| 2011/0280266 A1* | 11/2011 | Hayashi | H01S 5/02216 372/43.01 |
| 2012/0313115 A1* | 12/2012 | Joo | H01L 33/486 257/88 |
| 2013/0334544 A1* | 12/2013 | Luruthudass | H01L 31/12 257/82 |
| 2014/0307755 A1* | 10/2014 | Wojcik | H01S 5/02228 372/38.02 |

FOREIGN PATENT DOCUMENTS

| | | |
|---|---|---|
| CN | 103423608 A | 12/2013 |
| CN | 205050160 U | 2/2016 |
| DE | 203 02 873 U1 | 7/2004 |
| DE | 10 2011 116 534 A1 | 4/2013 |
| DE | 10 2011 056 700 A1 | 6/2013 |
| EP | 1 204 151 A1 | 5/2002 |
| JP | S58-068991 A | 4/1983 |
| JP | S63-136684 A | 6/1988 |
| JP | H05-129731 A | 5/1993 |
| JP | 2003-133626 A | 5/2003 |
| JP | 2003-179292 A | 6/2003 |
| JP | 2007-035794 A | 2/2007 |
| JP | 2009-170741 A | 7/2009 |
| JP | 2014-531132 A | 11/2014 |

OTHER PUBLICATIONS

First Office Action dated Dec. 30, 2019, of counterpart Chinese Application No. 201680067562.5, along with an English translation.

* cited by examiner

HOUSING HAVING A RECESS EXTERIOR FOR AN OPTOELECTRONIC COMPONENT

TECHNICAL FIELD

This disclosure relates to an optoelectronic component and a method of producing an optoelectronic component.

BACKGROUND

Optoelectronic components having an optoelectronic semiconductor chip arranged in a housing are known. In such optoelectronic components, the optoelectronic semiconductor chip may be arranged in a cavity of a housing body and encapsulated with an encapsulation compound. It may also be arranged on a bottom part of the housing and enclosed by a housing cover.

In such optoelectronic components, electromagnetic radiation emitted by the optoelectronic semiconductor chip generally emerges from the optoelectronic component through an exit or emission face of the component.

There is nonetheless a need to provide an improved optoelectronic component and an improved method of producing an optoelectronic component.

SUMMARY

We provide an optoelectronic component including an optoelectronic semiconductor chip that emits electromagnetic radiation, arranged in a housing, wherein the housing has an outer wall face and an exit face transparent to the electromagnetic radiation, the exit face is set back relative to the outer wall face in a direction of an interior of the housing, the optoelectronic semiconductor chip is arranged such that radiation emitted by the optoelectronic semiconductor chip in an emission direction can emerge from the optoelectronic component through the exit face, and the outer wall face has separating marks and the exit face is free of separating marks.

We also provide a method of producing an optoelectronic component having a housing, which has an outer wall face and an exit face, which is transparent to electromagnetic radiation emitted by an optoelectronic semiconductor chip arranged in the housing, wherein the exit face is set back relative to the outer wall face in a direction of the interior of the housing, the method including molding the exit face from a molding compound transparent to the radiation, in a housing part assembly by using a molding tool defining the exit face, and forming the outer wall face by separating the housing part assembly.

Figure 1:
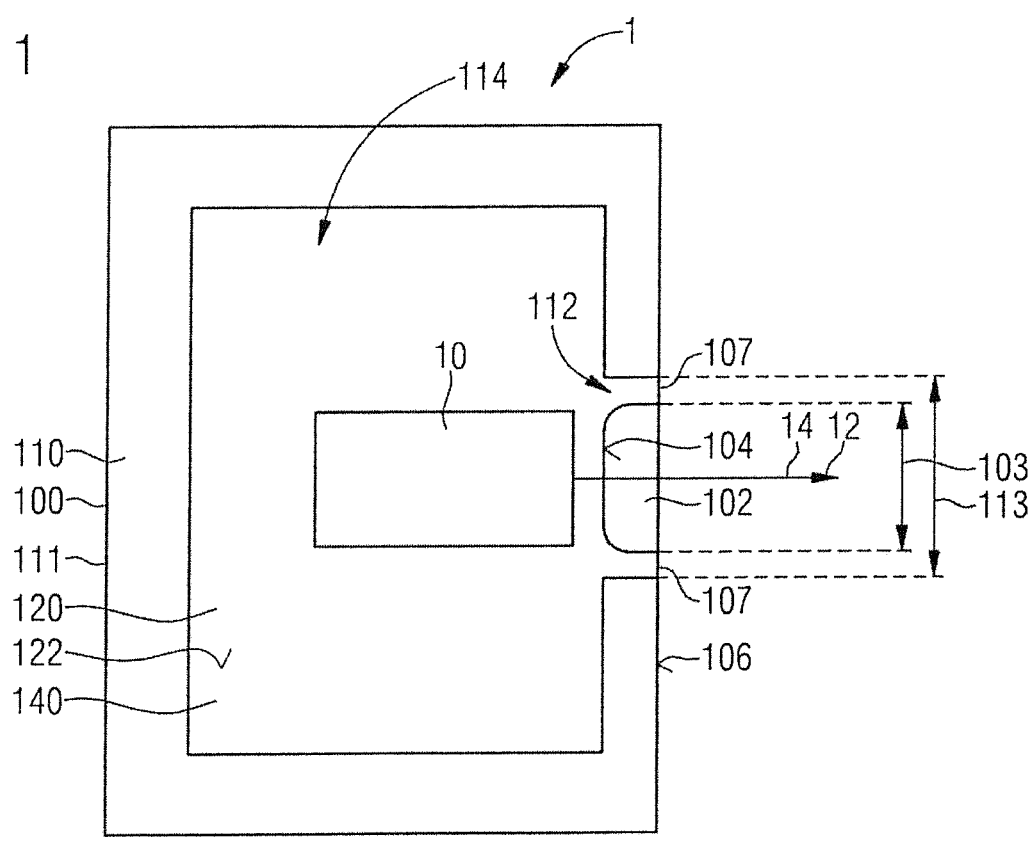
FIG. 1 shows a schematic plan view of an optoelectronic component.

LIST OF REFERENCES 1 optoelectronic component
2 further optoelectronic components
3 adjacent optoelectronic component
10 optoelectronic semiconductor chip
12 emission direction
14 emitted radiation
100 housing
102 recess
103 horizontal width of the exit face
104 exit face
106 outer wall face
107 part of the outer wall face
110 housing body
111 housing wall
112 opening
113 horizontal width of the opening
114 cavity
120 housing bottom
122 upper side
123 lower side
125 bottom recess
126 lead frame
127 contact element
128 chip contact pad
129 bottom contact pad
140 encapsulation compound
200 Housing part assembly with housing body
202 recess of the housing part assembly
205 separating plane
210 molding tool
212 part defining exit face
214 part defining recess
300 optoelectronic component
310 housing
311 outer wall face
312 housing cover
313 cavity
314 recess
316 Bearing face
317 lower side
318 upper side
319 side face
320 housing bottom
321 front edge
322 solder contact
330 base
334 height
340 separating marks

DETAILED DESCRIPTION

Our optoelectronic component comprises an optoelectronic semiconductor chip that emits electromagnetic radiation, arranged in a housing, the housing having an outer wall face and an exit face transparent for the electromagnetic radiation. The exit face is set back relative to the outer wall face in the direction of the interior of the housing, and the optoelectronic semiconductor chip is arranged such that radiation emitted by the optoelectronic semiconductor chip in an emission direction can emerge from the optoelectronic component through the exit face.

The exit face may, for example, be arranged in a recess arranged on the outer wall face of the housing. By the exit face being set back relative to the outer wall face in the direction of the interior of the housing, the optical properties of the exit face can be adapted in an advantageously straightforward way so that radiation emerging from the optoelectronic component is emitted in a beam having an advantageously high beam quality. The optical properties may, for example, be adapted such that advantageously low scattering losses, reflection losses or advantageously low deviation of the emitted beam take place at the exit face.

To adapt the optical properties, the exit face may, for example, be produced by a method allowing formation of a smooth exit face with a low losses. Such a method may, for example, be a molding method. The molding method may, for example, be a casting, injection-molding or compression-molding method. The molding method may also be referred to as a shaping method.

The outer wall face may, for example, be produced by an advantageously straightforward and economical method, for example, a separating method, sawing or breaking. If the outer wall face has a mold release slope, the exit face arranged set back may be formed without a mold release slope or with just a small mold release slope so that the emitted beam can advantageously pass perpendicularly through the exit face.

Production of the housing covers 312 in the housing part assembly and the subsequent division of the housing covers 312 by separation of the housing part assembly have the effect that the outer wall face 311 has separating marks 340 resulting from the separating method, but the exit face 104 arranged in the recess 314 is free of these separating marks. If the housing part assembly is separated by sawing or breaking, the outer wall face 311 may, for example, have a greater surface roughness than the exit face 104 because of the separating marks 340.

The exit face may be oriented perpendicularly to the emission direction. This leads to an advantageously low deviation of a beam directed in the emission direction at the exit face.

The optoelectronic semiconductor chip may be arranged above an upper side of a housing bottom of the housing. In this way, the optoelectronic semiconductor chip may be contacted via contact elements arranged on the upper side of the housing bottom and, in particular, the optoelectronic semiconductor chip may be contacted on its lower side.

The emission direction may be oriented parallel to the upper side of the housing bottom. An optoelectronic component having such a semiconductor chip may advantageously be configured as a so-called "sidelooker" component, which may be arranged on a mounting face such that it emits the electromagnetic radiation parallel to the mounting face.

The upper side of the housing bottom may have, in the region of the exit face, a bottom recess located between the optoelectronic semiconductor chip and the outer wall face. In this way, it is advantageously possible to avoid radiation emerging from the optoelectronic semiconductor chip being shadowed at the upper side of the housing bottom. This may be advantageous particularly in optoelectronic semiconductor chips emitting electromagnetic radiation in a beam with high divergence. The bottom recess makes it possible to arrange even an optoelectronic semiconductor chip emitting divergent radiation at an advantageously large distance from the outer wall face of the optoelectronic semiconductor chip.

The optoelectronic semiconductor chip may be arranged on a base arranged on the upper side. This makes it possible to arrange a semiconductor chip emitting divergent radiation at an advantageously large distance from the outer wall face.

The base may be formed by a metallization layer applied onto the upper side, and the metallization layer may have a height, oriented perpendicularly to the upper side, of at least 20 µm, in particular 100 µm to 300 µm. A base configured as a metallization layer may be produced in an advantageously straightforward and economical way.

The housing may comprise a housing body having the housing bottom, and an encapsulation compound, a cavity adjacent to the upper side of the housing bottom being formed in the housing body. The housing body comprises at least a part of the outer wall face. The cavity is at least partially encapsulated with the encapsulation compound, and the exit face is formed from the encapsulation compound.

In such an optoelectronic component, the housing body, with the outer wall face, and the exit face may advantageously consist of different materials. In such a case, on the one hand the material properties of the housing body may be adapted independently of the exit face, for example, with a view to the least possible shrinkage during production and a mechanical stability that is as high as possible. On the other hand, the housing body and the outer wall face may, unlike the exit face, consist of a material that is nontransparent for the electromagnetic radiation so that the electromagnetic radiation only emerges from the electromagnetic component through the exit face.

The housing body may have an opening. The exit face is arranged in the opening, and the opening is at least partially encapsulated with the encapsulation compound.

Such an optoelectronic component may be produced advantageously straightforwardly and economically in a housing part assembly. For example, the cavities of two housing bodies arranged next to one another in the housing assembly may respectively connect to one another by the openings. The exit faces may then be formed by a part defining the exit faces of a molding tool arranged in the openings and the cavities of the two housing bodies adjacent to one another being encapsulated with the encapsulation compound.

A part of the outer wall face may be formed from the encapsulation compound. When producing the optoelectronic component, this makes it possible during formation of the exit face to use a tool whose horizontal width transverse to the opening and parallel to the housing bottom is less than the corresponding horizontal width of the opening. In this way, advantageously large positioning inaccuracies may be tolerated when arranging the molding tool on the optoelectronic component.

The housing bottom may comprise a contact element having a chip contact pad and a bottom contact pad, the chip contact pad and the bottom contact pad conductively connected to one another. The contact element extends from the upper side of the housing bottom to a lower side, located opposite the upper side, of the housing bottom. The chip contact pad forms a part of the upper side of the housing bottom, and the bottom contact pad forms a part of the lower side of the housing bottom. Such an optoelectronic component may be produced in an advantageously straightforward and economical way. For example, the contact element may be part of a lead frame around which a housing body molding compound forming the housing body is molded during production of the housing body.

The housing may comprise a housing cover transparent to the radiation and arranged on the housing bottom. The outer wall face and the exit face may be formed at least partially on the housing cover, and the housing cover may be arranged on the housing bottom.

The housing cover may, for example, have been produced in combination with other housing covers. If the individual covers have been divided by a separation method during which the outer wall faces have been formed, in the case of a housing cover in which the exit face is set back relative to the outer wall face only the outer wall face, but not the exit face, has separating marks, for example, grooves or scratches.

The outer wall face of the housing cover may also have a mold release slope so that the outer wall face is not oriented perpendicularly relative to the emission direction of the optoelectronic semiconductor chip. This may, for example, be the case when the housing cover has been produced by a molding method. An exit face set back relative to the outer wall face in the direction of the interior of the housing may in these cases advantageously be formed without a mold release slope, and may be arranged perpendicularly to the emission direction.

The housing bottom may comprise a circuit board or a ceramic substrate.

A method of producing an optoelectronic component having a housing, which has an outer wall face and an exit face, which is set back relative to the outer wall face in the direction of the interior of the housing and is transparent to electromagnetic radiation emitted by an optoelectronic semiconductor chip arranged in the housing, comprises as one step molding of the exit face from a molding compound, which is transparent to the radiation, in a housing part assembly by using a molding tool which defines the exit face.

By the exit face being formed from a molding compound with a molding tool, the exit face can advantageously be formed to be particularly smooth. The radiation can therefore emerge from the optoelectronic component with an advantageously high beam quality and, for example, scattering and reflection losses or beam deviation or expansion at the exit face are reduced.

The transparent molding compound may, for example, be an encapsulation compound introduced into a cavity of a housing body of the optoelectronic component. The transparent molding compound may also be a molding compound from which a housing part of the optoelectronic component, for example, a housing cover is formed.

The method may comprise formation of the outer wall face by separating the housing part assembly. The separation may, for example, be carried out by cutting, sawing, breaking or laser cutting. The housing part assembly comprises housing parts, connected to one another, of a plurality of optoelectronic components. The housing parts may, for example, be housing bodies or housing covers of the optoelectronic components. The housing parts may, for example, be uniform in terms of material and connected to one another directly adjacent to one another. The housing part assembly may, for example, have been produced in a molding method as a molded body. A housing part assembly with material uniformity of molded bodies merging into one another may be produced by a common molding tool in which the molds of the individual molded bodies merge into one another.

The exit face may be formed in a recess, defined by the molding tool, of the housing part assembly, and the recess may be separated during the separation of the housing part assembly. Because of the exit face being set back into the interior of the housing, it advantageously does not come in contact with the separating tool during the separating method, and the surface condition of the exit face is determined only by the molding method.

The method may comprise as further steps provision of the housing part assembly, the housing part assembly comprising a housing body of the housing with a cavity intended to receive the optoelectronic semiconductor chip, arrangement of the molding tool on the cavity, and filling of the cavity with the transparent molding compound. An advantageously smooth exit face can thereby be formed in a straightforward way from the transparent molding compound used to fill the cavity. Formation of the exit face and filling the cavity may in this case be carried out in a single working step.

A part, defining the exit face, of the molding tool may be arranged in an opening of the housing body. In this way, it is possible in a straightforward way to achieve the effect that the exit face is exposed on the outer side of the housing and the radiation can emerge from the optoelectronic component.

The housing part assembly, comprising a housing cover of the housing, may be molded from the transparent molding compound together with the exit face, and the method comprises as a further step arrangement of the housing cover on a housing bottom of the housing. Formation of the exit face together with housing covers manufactured in an assembly allows advantageously straightforward and economical production of the optoelectronic component. The outer wall face of the housing may, for example, be formed along a separating plane along which the housing part assembly is separated when dividing the housing cover. Since the exit face is set back in the direction of the interior of the housing, the exit face advantageously does not come in contact with the separating tool, and scratching of the exit face during the separating process is avoided.

The above-described properties, features and advantages, as well as the way in which they are achieved, will become more clearly and readily comprehensible in conjunction with the following description of the examples, which will be explained in more detail in connection with the drawings.

FIG. 1 shows a plan view of an optoelectronic component 1 comprising a housing 100 and an optoelectronic semiconductor chip 10 arranged in the housing 100. The optoelectronic semiconductor chip 10 is configured to emit a beam of electromagnetic radiation 14 in an emission direction 12. The optoelectronic semiconductor chip 10 may, for example, be a laser chip configured to emit laser radiation, in particular coherent radiation, as emitted radiation. As an alternative, the optoelectronic semiconductor chip 10 may also be configured to emit incoherent radiation and, for example, it may be formed as an LED chip.

The housing 100 comprises a housing body 110 in which a cavity 114 is formed. The cavity 114 of the housing body 110 is open upward, and thus forms an aperture in the upper side of the housing body 110. The housing body 110 furthermore comprises a housing bottom 120 adjacent to the cavity 114 via an upper side 122. In the plan view of the optoelectronic component 1 as represented in FIG. 1, the upper side 122 of the housing bottom 120 is oriented parallel to the plane of the figure.

The cavity 114 is surrounded by a housing wall 111 of the housing body 110. The housing wall 111 is formed adjacent to the upper side 122 of the housing bottom 120 and may, for example, connect to the housing bottom 120 with material uniformity. The housing wall 111 is adjacent to the cavity 114 with its inner sides, and the outer sides of the housing wall form parts of the outer walls of the housing body 110, or respectively parts of the outer walls of the optoelectronic component 1. The housing wall 111 of the optoelectronic component 1 has different wall thicknesses, the wall thickness on the side located in the emission direction 12 being thinner than the wall thickness on the other sides. In alternative examples of the optoelectronic component 1, the housing wall 111 may also have the same wall thickness on all sides.

The housing wall 111, or the housing body 110 overall, may be configured to be nontransparent for the emitted radiation 14. For example, the housing wall 111 and the housing body 110 may comprise a plastic, for example, a thermoplastic and/or thermosetting material. In the example of the optoelectronic component 1, the housing wall 111 is formed from a nontransparent plastic.

The optoelectronic semiconductor chip 10 is arranged above the upper side 122 of the housing bottom 120 inside the cavity 114 and surrounded by the housing wall 111. In the example of the optoelectronic component 1, the optoelectronic semiconductor chip 10 is arranged directly on the housing bottom 120.

The optoelectronic semiconductor chip 10 is configured to emit the emitted electromagnetic radiation 14 parallel to the upper side 122 of the housing bottom 120, and the emission direction 12 is thus oriented parallel to the upper side 122 of the housing bottom 120. The electromagnetic radiation 14 may be emitted divergently by the optoelectronic semiconductor chip 10. In such a case, the emission direction 12 or the radiation direction refer to the center of the emitted radiation, or the direction in which the radiation 14 has the greatest intensity. The bundle of rays emitted by the optoelectronic semiconductor chip 10 is thus centered around the emission direction 12.

The optoelectronic semiconductor chip 10 may, for example, be configured as an edge emitter, in which the emitted radiation 14 is emitted at an edge forming an active layer oriented parallel to the upper side 122, of the optoelectronic semiconductor chip 10 at a side face, oriented perpendicularly to the upper side 122, of the optoelectronic semiconductor chip 10. This edge may, for example, be formed at a side face, oriented parallel to the upper side 122 and located opposite the upper side 122, of the optoelectronic semiconductor chip 10.

The housing 100 of the optoelectronic component 1 has, on an outer wall located in the emission direction 12, an outer wall face 106 in which a recess 102 directed in the direction of the interior of the optoelectronic component 1 is formed. An exit face 104 transparent for the emitted radiation 14 is arranged in the recess 102. The exit face 104 is in this case arranged set back relative to the outer wall face 106 in the direction of the interior of the housing 100, i.e., in the case of the optoelectronic component 1 in the direction of the semiconductor chip 10. The outer wall face 106 and the exit face 104 respectively form a part of the outer wall of the housing 100, or of the housing body 110.

The optoelectronic semiconductor chip 10 is oriented inside the housing 100 relative to the exit face 104 so that the emitted radiation 14 can emerge from the optoelectronic component 1 through the exit face 104. In the optoelectronic component 1, the side of the optoelectronic semiconductor chip 10 on which the radiation 14 is emitted is arranged facing toward the exit face 104. The exit face 104 is oriented essentially perpendicularly to the emission direction 12.

An opening 112 of the housing body 110 is formed in the housing wall 111 to form the exit face 104 set back relative to the outer wall face 106. In the opening 112, the cavity 114 of the housing body 110 is exposed at the outer wall face 106 of the housing body 110.

The cavity 114 and the optoelectronic semiconductor chip 10 arranged in the cavity 114 are encapsulated with an encapsulation compound 140 comprising a material transparent to the emitted radiation 14, for example, a silicone. The opening 112 in the housing body 110 is likewise partially encapsulated with the encapsulation compound 140. The encapsulation compound 140 forms a transparent molding compound, with which the cavity 114 of the housing body 110 is filled. The encapsulation compound, or molding compound may, for example, have been introduced into the cavity 114 in a compression-molding method.

The recess 102 is formed in the encapsulation compound 104, and the exit face 104 is formed from the encapsulation compound 140. The exit face 104 and the recess 102 are arranged inside the opening 112. The exit face 104 and the recess 102 have a horizontal width 103, in a direction oriented parallel to the upper side 122 of the housing bottom 120, which is less than a horizontal width 113, oriented in the same direction, of the opening 112. In the optoelectronic component 1, the recess 102 is arranged essentially centrally inside the opening 112, and the encapsulation compound 140 is outwardly flush with the outer wall face 106 at the edges of the opening 112. The encapsulation compound 140 forms parts 107 of the outer wall face 106 in a regions respectively located between the ends of the housing wall 111 and the recess 102.

In other examples of the optoelectronic component 1, the recess 102 may also be arranged not centrally inside the opening 112. The recess 102 may also be bounded on one or both sides by the ends of the housing wall 111 so that the exit face 104 is adjacent to the housing wall 111 there and the part 107, formed by the encapsulation compound 140, of the outer wall face 106 is absent.

The exit face 104 is formed entirely from the encapsulation compound 140 which is transparent to the radiation 14, and the exit face 104 is therefore also transparent to the radiation 14. One part of the outer wall face 106 is comprised by the housing body 110, while the parts 107 of the outer wall face 106 are formed from the encapsulation compound 140. Since, in the optoelectronic component 1, the housing body 110 is formed from a material that is not transparent to the radiation 14, the outer wall face 106 is also formed partially from the material that is not transparent to the radiation 14, of the housing body 110 and partially from the transparent encapsulation compound 140.

Figure 2:
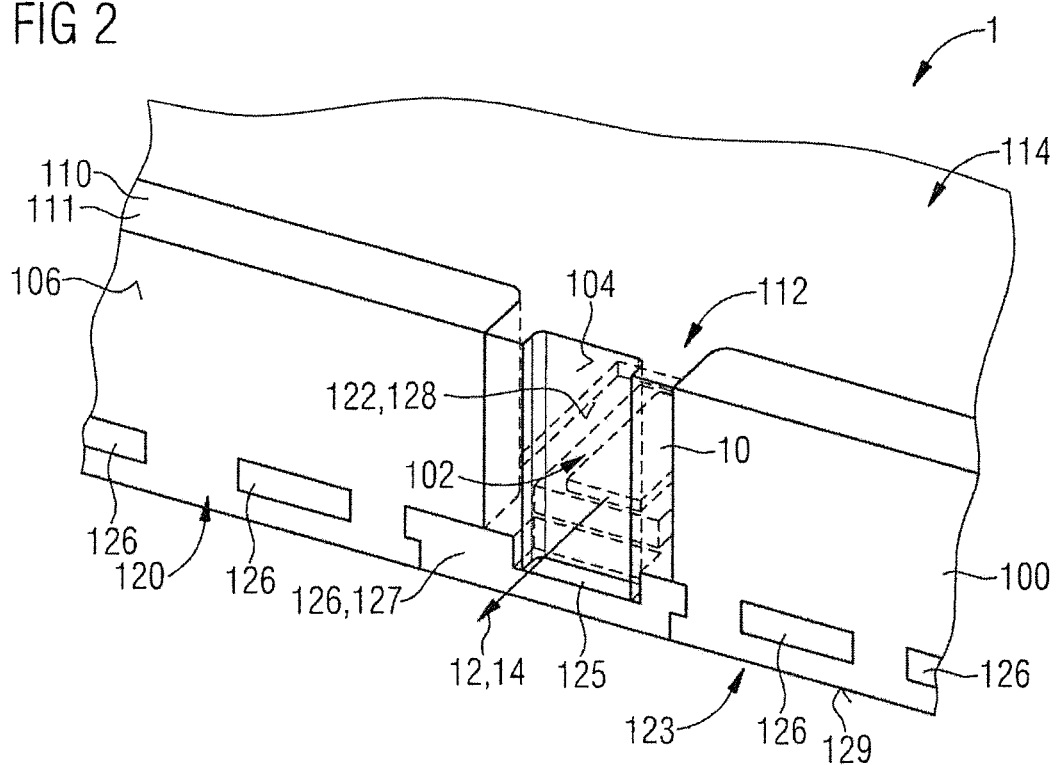
FIG. 2 shows a schematic perspective view of the optoelectronic component.

FIG. 2 shows a perspective view of the optoelectronic component 1. The housing body 110 with the cavity 114 and the outer wall face 106 can be seen, as well as the encapsulation compound 140 introduced into the cavity 114. The recess 102, formed in the encapsulation compound 140, with the exit face 104 is likewise represented.

In the optoelectronic component 1, the cavity 114 is encapsulated fully with the encapsulation compound 140. In particular, the encapsulation compound 140 extends in a direction perpendicular to the upper side 122 of the housing bottom 120 as far as the upper side of the optoelectronic component 1. In other examples of the optoelectronic component 1, however, the cavity 114 may also be encapsulated only partially with the encapsulation compound 140. In such a case, the cavity 114 may be filled only up to a height less than the height of the optoelectronic component 1 in the direction perpendicular to the upper side 122 of the housing bottom 120.

In the optoelectronic component 1, the optoelectronic semiconductor chip 10 arranged above the upper side 122 of the housing bottom 120 is arranged directly on the upper side 122 of the housing bottom 120. In other examples of the optoelectronic component 1, however, further elements, for example, a spacer or base, for example, a submount may also be arranged between the housing bottom 120 and the optoelectronic semiconductor chip 10. This is also described in connection with FIG. 6.

The housing bottom 120 of the housing body 110 comprises a lead frame 126 around which a molding compound, or more accurately a housing body molding compound, is molded. The molding compound in this case consists of the material from which the housing wall 111 of the housing body 110 is formed. In particular, the housing body molding compound may be electrically insulating and/or not transparent to the emitted radiation 14. The lead frame 126 is configured to be electrically conductive, and comprises an electrically conductive material, for example, a metal. The lead frame 126 comprises a plurality of contact elements embedded in the housing bottom 120 such that they are each electrically insulated from one another. The contact elements are partially exposed on the outer wall face 106 and therefore likewise form a part of the outer wall face 106.

The optoelectronic semiconductor chip 10 is arranged on a contact element 127 of the lead frame 126. The contact element 127 extends from the upper side 122 of the housing bottom 120 to a lower side 123, located opposite the upper side 122, of the housing bottom 120. The contact element 127 comprises a chip contact pad 128 forming a part of the upper side 122 of the housing bottom 120. The optoelectronic semiconductor chip 10 is arranged on the chip contact pad 128 such that it emits the electromagnetic radiation 14 essentially parallel to the chip contact pad 128.

The contact element 127 shows a bottom contact pad 129 located opposite the chip contact pad 128 and forms a part of the lower side 123 of the housing bottom 120. The bottom contact pad 129 is exposed on the lower side 123 of the housing bottom 120 so that the optoelectronic component 1 can be electrically conductively contacted from the outside via the bottom contact pad 129 of the contact element 127. The chip contact pad 128 and the bottom contact pad 129 of the contact element 127 are formed as essentially planar wall faces of the contact element 127, and electrically conductively connect to one another by the electrically conductive material of the contact element 127.

Besides the chip contact pad 128, the upper side 122 of the housing bottom 120 also comprises a region formed from the insulating material of the housing body 110. This region of the upper side 122 may be located in the same plane as the chip contact pad 128 of the contact element 127, or it may be arranged above or below the chip contact pad 128 in a direction perpendicular to the chip contact pad 128. In the optoelectronic component 1, the region, formed from the insulating material, of the upper side 122 of the housing bottom 120 is arranged above the chip contact pad 128. Overall, the entire upper side 122 of the housing bottom 120 may be formed to be planar, or it may comprise regions elevated and/or lowered relative to the chip contact pad 128.

The lower side 123, located opposite the upper side 122, of the housing bottom 120 may likewise essentially either be formed to be planar or may comprise regions elevated or sunk relative to the bottom contact pad 129. If the bottom contact pad 129 is configured to be essentially planar, it may be used as a bearing face with which the optoelectronic component 1 may be arranged on a carrier, for example, on a circuit board. To this end, the optoelectronic component 1 may, for example, as represented in FIG. 2, be formed as a QFN component (quad flat no leads component) with an essentially planar lower side 123 of the housing bottom 120.

In the optoelectronic component 1, the upper side 122 of the housing bottom 120 has a bottom recess 125 in the region of the exit face 104. The bottom recess 125 is arranged in the opening 112 of the housing body 110. The bottom recess 125 is arranged between the outer wall face 106 and the optoelectronic semiconductor chip 10 such that it is located below the beam of the electromagnetic radiation 14 emitted by the optoelectronic semiconductor chip 10 in the emission direction 12. The bottom recess 125 is used to avoid the emitted radiation 14 being shadowed by the housing bottom 120. This is described in more detail in connection with FIG. 6.

The bottom recess 125 is formed in the contact element 127. The bottom recess 125 is in this case formed on an edge of the contact element 127, at which the chip contact pad 128 and a side face, forming a part of the outer wall face 106, of the contact element 127 meet one another. The depth of the recess 125 in a direction perpendicular to the chip contact pad 128 of the contact element 127 may, for example, be 10% to 90% of the total thickness of the contact element 127 in this direction. In particular, the depth of the recess 125 may be 70% of the total thickness of the contact element 127. This ensures on the one hand that the contact element 127, and therefore the optoelectronic component 1, is sufficiently mechanically stable in the region of the bottom recess 125 and, on the other hand, that the electromagnetic radiation emitted by the optoelectronic semiconductor chip 10 is not shadowed in the region of the bottom recess 125.

In other examples of the optoelectronic component 1, the housing bottom 120 may also be formed without the bottom recess 125.

The contact element 127, or the lead frame 126 comprising the contact element 127, may have a thickness of 100 μm to 500 μm, in particular a thickness of 200 to 250 μm, in the direction perpendicular to the chip contact pad 128 of the contact element 127. Such a thickness ensures, on the one hand, a sufficient mechanical stability of the optoelectronic component 1 and, on the other hand, a sufficiently flat configuration of the optoelectronic component 1.

All other contact elements of the lead frame 126 may also have different thicknesses perpendicularly to the chip contact pad 128 and, therefore, for example, form steps or recesses. During production of the optoelectronic component 1, the structuring, required to form differently thick contact elements of the lead frame 126 may, for example, be carried out by an etching process.

The bottom recess 125 is partially encapsulated with the encapsulation compound 140 of the housing 100 of the optoelectronic component 1. The recess 102 in the encapsulation compound 140 with the exit face 104 is partially formed in the part of the encapsulation compound 140 arranged in the bottom recess 125. The exit face 104 therefore also extends into the bottom recess 125. In this way, the part of the emitted radiation 14 passing through the bottom recess 125 can also emerge from the optoelectronic component 1 through the exit face 104. As an alternative, in other examples of the optoelectronic component 1, the exit face 104 may also be arranged closer to the optoelectronic semiconductor chip 10 so that the exit face 104 is arranged between the bottom recess 125 and the optoelectronic semiconductor chip 10, i.e., it no longer extends into the bottom recess 125.

In other examples of the optoelectronic component 1, the housing bottom 120 may also be formed such that the contact element 127 is not exposed on the outer wall face 106 but instead the insulating material of the housing body 110 is located between the outer wall face 106 and the contact element 127. In such a case, the bottom recess 125 may also be formed in the electrically insulating material of the housing body 110.

The distance of the optoelectronic semiconductor chip 10 from the outer wall face 106 is dimensioned such that the electromagnetic radiation emitted by the optoelectronic semiconductor chip 10 is not shadowed by the housing bottom 120.

During production of the optoelectronic component 1, the electrically insulating material of the housing body 110 is initially molded around the lead frame 126, and the housing body 110 comprising the electrically insulating material and the lead frame 126 is thus produced. In this case, the housing bodies 110 of a plurality of optoelectronic components formed like the optoelectronic component 1, are simultaneously manufactured in an assembly. To this end, the lead frame 126 comprises all contact elements of the optoelectronic components to be manufactured. The insulating material of the housing bodies of the optoelectronic components is then molded around the contact elements in one working step. A housing part assembly is thereby formed, which comprises the housing bodies 110 of all optoelectronic components 1 to be manufactured.

Figure 3:
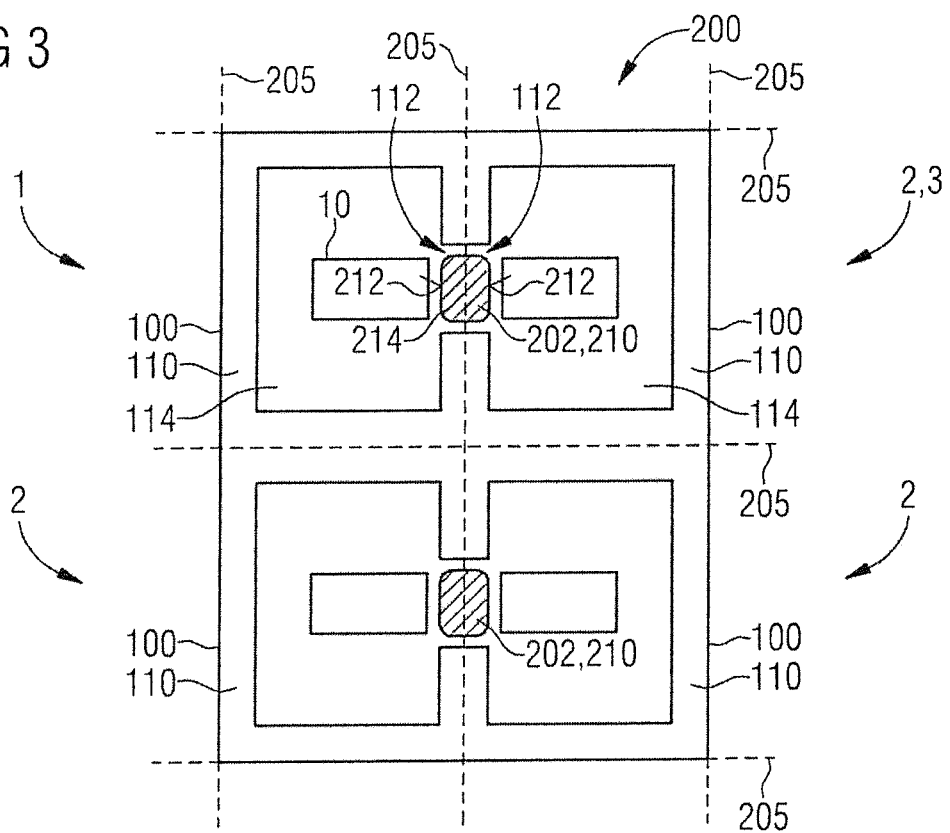
FIG. 3 shows a schematic detail of a housing part assembly comprising the optoelectronic component.

FIG. 3 shows a detail of a housing part assembly 200 produced by our method and, besides the housing body 110 of the optoelectronic component 1, comprises the housing bodies 110 of in total three further optoelectronic components 2. If no differences are described below, the further optoelectronic components 2 are configured like the optoelectronic component 1.

The housing bodies 110 of the four optoelectronic components 1, 2 represented are formed adjacent to one another in the housing part assembly 200 in a grid of 2×2 components. The housing walls 111 of optoelectronic components 1, 2 respectively arranged adjacent to one another in the housing assembly 200 are formed next to one another with material uniformity.

The opening 112 in the housing wall 111 of the housing body 110 of the optoelectronic component 1 is formed facing toward the opening 112 of the housing body 110 of an optoelectronic component 3 adjacent to the optoelectronic component 1. The cavities 114 of the housing bodies 110 of the optoelectronic component 1 and the adjacent optoelectronic component 3 are therefore connected to one another by the openings 112. Similarly, the housing bodies 110 of the other two further optoelectronic components 2 are arranged in the housing part assembly 200 such that the openings 112 of the relevant housing bodies 110 are respectively adjacent to one another and the cavities 114 of the other two further optoelectronic components 2 connect to one another by the openings 112.

Besides the four optoelectronic components 1, 2 represented, the housing part assembly 200 may comprise additional optoelectronic components, the outer walls 111 of two optoelectronic components adjacent to one another respectively being configured to be adjacent to one another and connected to one another with material uniformity. Respectively two of the additional optoelectronic components are always arranged such that the openings 112 in the housing bodies 110 are adjacent to one another and the relevant cavities 114 connect to one another.

After molding the electrically insulating housing material of the housing body 110 around the lead frame 126, an optoelectronic semiconductor chip 10 is respectively arranged in each of the cavities 114 of the optoelectronic components 1, 2. Subsequently a transparent molding compound is introduced in the form of the encapsulation compound 140 into the cavities 114, connected to one another by the openings 112, of the housing bodies 110 so that the optoelectronic semiconductor chips 10 are partially or fully surrounded by the transparent molding compound.

The exit faces 104 of the optoelectronic components 1, 2 are molded from the molding compound by a molding tool 210 that defines the exit faces 104 being arranged on the housing part assembly 200. The molding tool 210 comprises parts 214 defining the recesses 102. Parts 212 of the molding tool 210 defining the exit faces 104 are respectively formed on edge faces of the parts 214 of the molding tool 210 which define the recesses 102. The parts 214 of the molding tool 210 defining the recesses 102 therefore comprise the negative form of the recesses 102 and the exit faces 104. The molding tool 210 is arranged at the cavities 114 such that the parts 212 defining the exit faces 104 are arranged essentially perpendicularly to the emission direction 12.

The recesses 102 of optoelectronic components 1, 2 with openings 112 respectively opposing one another are respectively formed adjacent to one another. To this end, two of the parts 214 defining the recesses 102 are respectively arranged connected to one another in the molding tool 210, specifically such that the parts 212 defining the exit faces 104 are arranged on mutually opposing sides of the parts 214 of the molding tool 210 defining the recesses 102.

The molding tool 210 is arranged at the cavities 114 of the housing bodies 110. The parts 214 defining the recesses 102 are respectively arranged essentially centrally in the emission direction 12 in the mutually connected openings 112 of the optoelectronic components 1, 3. The parts 214 defining the recesses 102 are arranged centrally in a direction perpendicular to the emission direction 12 and parallel to the upper side 122 of the housing bottom 120 in the mutually connected recesses 102.

The horizontal width of the parts 214 of the molding tool 210 defining the recesses 102, in the direction perpendicular to the emission direction 12 and parallel to the upper side 122, is less than the horizontal width 113 of the openings 112. The parts 214 of the molding tool 210 defining the recesses 102 therefore do not entirely fill the openings 112 in this direction, and the cavities 140 of components 1, 2 connected to one another by the openings 112 still connect to one another even after the molding tool 210 has been arranged.

The molding tool 210 may, for example, be formed by stamps to be pressed into the cavities 114 from above. The stamps have an essentially planar lower side oriented parallel to the upper side 122 of the housing bottom 120 and introduced essentially perpendicularly to the upper side 122 into the cavity 114 from above. The parts 214 of the molding tool 210 defining the recesses 102 form elevations in the lower sides of the molding tool 210 while the parts 212 of the molding tool 210 defining the exit faces 104 constitute side faces of these elevations. The parts 212 of the molding tool 210 defining the exit faces 104 stand essentially perpendicularly on the lower side of the molding tool 210.

The elevations in the molding tool 210 are configured relative to the lower side with a height such that they bear on the contact elements 127 of the optoelectronic components 1, 3, particularly in the bottom recesses 125 of the contact elements 127, when the molding tool 210 is positioned relative to the housing part assembly 200 in the position used to cure the transparent molding compound. The lower part of the molding tool 210 is positioned essentially parallel to the emission direction 12 on the housing part assembly 200.

By the molding tool 210, the recesses 102 are formed in the optoelectronic components 1, 2, or more precisely in the transparent molding compound such that the recesses 102 of optoelectronic components 1, 2 whose cavities 114 connect to one another by the openings 112 are respectively formed adjacent to one another. In this way, the recesses 102 of respectively two optoelectronic components 1, 2 arranged adjacent next to one another together form a recess 202 in the housing part assembly 200. In particular, the recess 102 of the optoelectronic component 1 and the recess 102 of the optoelectronic component 3 adjacent thereto form a recess 202 in the housing assembly 200.

In the optoelectronic components 1, 2, the recesses 202 of the housing part assembly 200 are formed in the transparent molding compound. In other examples of the method, the parts of the molding tool 210 defining the recesses 102 may also have a horizontal width which corresponds to the horizontal width of the openings 112. In this case, only the exit faces 102 are formed from the transparent molding compound, and the side walls of recess 102 are formed by the side walls of the openings 112.

After molding exit faces 104 from the transparent molding compound, the optoelectronic components 1, 2 are divided by the housing part assembly 200 being separated along separating planes 205. The separating planes 205 in this case extend, inter alia, along the outer wall faces 206 so that the outer wall faces 106 are formed during the separating process. The separating process may, for example, be carried out by sawing, breaking or laser cutting.

During the separation of the housing part assembly 200 along the separating planes 200, the recesses 202 defined in the housing part assembly 200 by the molding tool 210 are likewise separated. The separation may, for example, be carried out in the emission direction 12 centrally through the recesses 202. Separation of the housing part assembly 200 along the separating planes 205 produces optoelectronic components 1, 2 in which the exit faces 104 defined by the molding tool 210 are respectively formed set back relative to the outer wall faces 106 in the direction of the interior of the housing 100.

The separating planes 205 extend along the outer wall faces 106 of the optoelectronic components 1, 2. After the separation of the housing part assembly 200 with the housing bodies 110, the outer wall faces 106 have separating marks caused by contact of a separating tool used for the separation. The separating marks may, for example, be scratches, grooves, grinding tracks or burrs. If a laser is used for separation of the housing bodies, the separating marks may also comprise meltings or melt tracks.

The arrangement of the molding tool 210 on the cavities 114 may be carried out either before or after the filling of the cavities 114 with the transparent molding compound. The cavities 114 may be filled with the encapsulation compound 140 forming the transparent molding compound by using the molding tool 210, for example, in a compression-molding method. In alternative examples of the method of producing the optoelectronic components 1, 2 in the housing part assembly 200, the transparent molding compound may also be cast or injection-molded into the cavities 114.

The distance of the optoelectronic semiconductor chip 10 from the exit face 104 is dimensioned such that, between the optoelectronic semiconductor chip 10 and the exit face, enough material of the encapsulation compound 140 remains to ensure sufficient mechanical stability of the optoelectronic component 1. The optoelectronic semiconductor chip 10 may, for example, be a distance measuring 50 µm to 600 µm, in particular 100 µm to 300 µm, from the exit face 104. For example, the distance may be 150 µm.

A depth of the recess 102, oriented parallel to the emission direction 12, is dimensioned to ensure that the exit face 104 does not come in contact with the separating tool, for example, with a saw or laser beam during the separating process of forming the outer wall face 106. In this case, process tolerances are taken into account, for example, relating to the accuracy of the relative orientation of the separating tool and the housing 100. The depth of the recess 102, oriented parallel to the emission direction 12 may, for example, be 125 µm to 700 µm, in particular 250 µm to 350 µm. For example, the depth of the recess 102 may be 300 µm.

Figure 4:
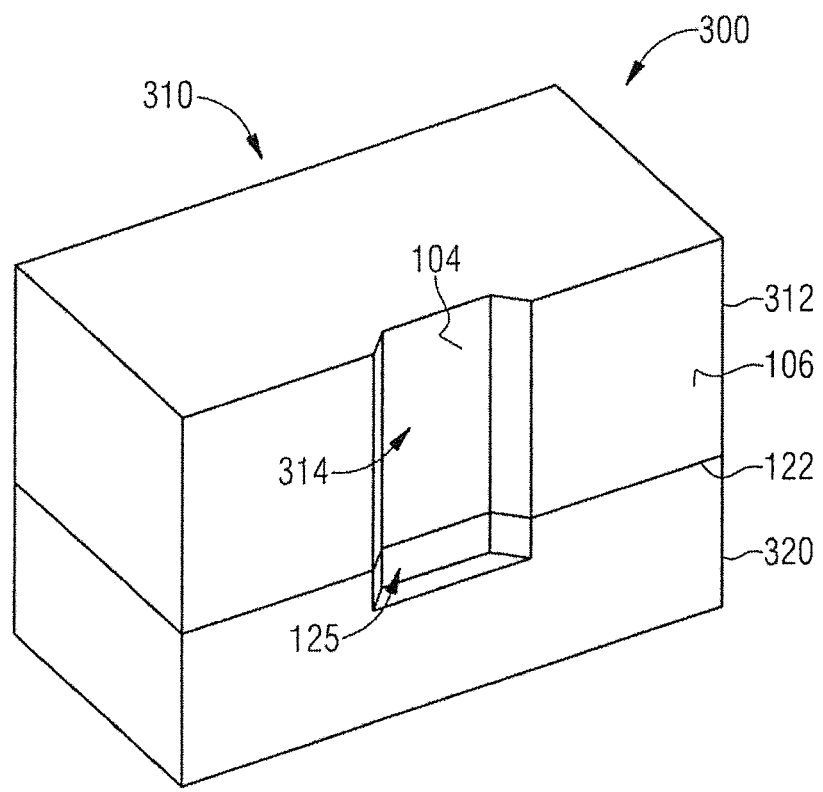
FIG. 4 shows a schematic perspective view of a further optoelectronic component.

FIG. 4 shows a perspective view of an optoelectronic component 300. The constituents of the optoelectronic component 300 having functional or structural similarities with constituents of the optoelectronic component 1 are described below by the same terms and are denoted by the same references.

Like the optoelectronic component 1, the optoelectronic component 300 has a housing 310 comprising a housing bottom 320. Like the housing bottom 120 of the optoelectronic component 1, the housing bottom 320 comprises the bottom recess 125 on an upper side 122. The shape and positioning of the bottom recess 125 correspond in the optoelectronic component 300 to the shape and positioning of the bottom recess 125 of the optoelectronic component 1.

Figure 5:
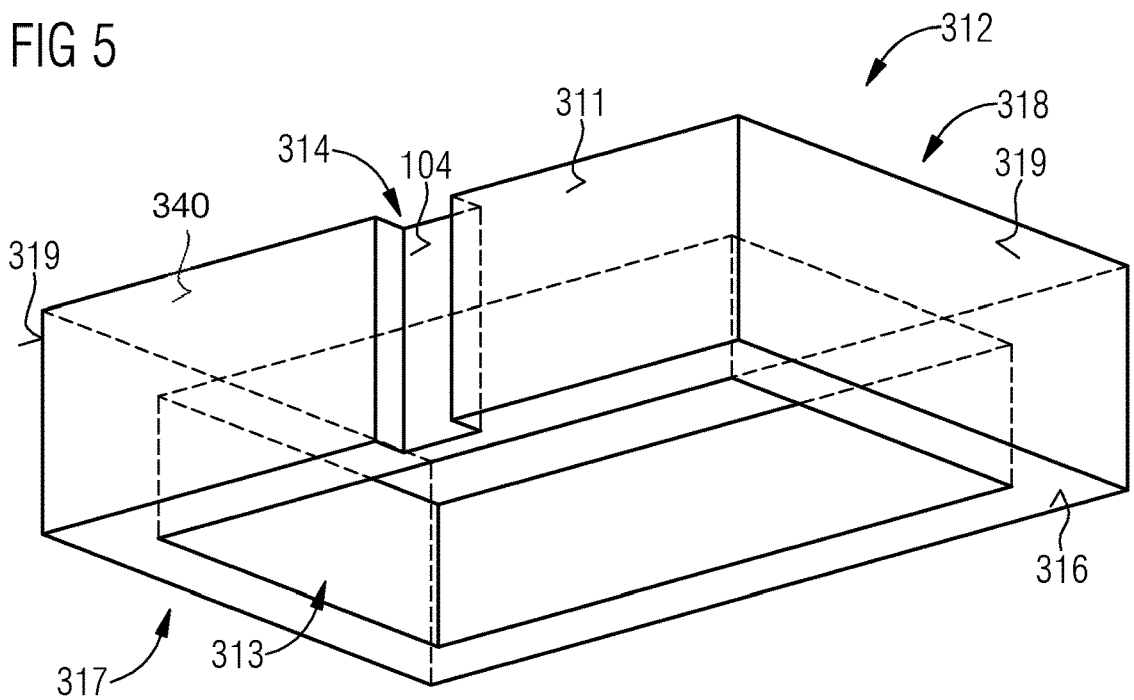
FIG. 5 shows a schematic perspective view of a housing cover of the further optoelectronic component.

Instead of the housing wall 111, the optoelectronic component 300 comprises a housing cover 312. The housing cover 312 is represented in a perspective view in FIG. 5. The housing cover 312 is configured essentially in the shape of a cuboid with planar outer faces. The housing cover 312 comprises, on a lower side 317, an essentially planar bearing face 316 with which it bears on the upper side 122 of the housing bottom 320. Formed on the lower side 317 of the housing cover 312, there is a cavity 313 enclosing an optoelectronic semiconductor chip 10 arranged inside the housing 310 when the housing cover 312 is arranged on the housing bottom 320. If no differences are described below, the optoelectronic semiconductor chip 10 (not represented in FIGS. 4 and 5) of the optoelectronic component 300 is configured and arranged like the optoelectronic semiconductor chip 10 of the optoelectronic component 1.

The housing cover 312 is formed from a material transparent to the radiation 14 emitted by the optoelectronic component 10. For example, the housing cover 312 may be formed from a plastic.

On its outer side, the housing cover 312 has four side faces 319 respectively extending from the lower side 317 to an upper side 318, located opposite the lower side 317, of the housing cover 312. An outer wall face 311 of the housing 310 formed by one of the side faces 319 of the housing cover 312 has a recess 314 directed into the interior of the housing 310. An edge face of the recess 314, located inside the recess 314, forms an exit face 104 set back relative to the outer wall face 311 in the direction of the interior of the housing 310, or the housing cover 312. The exit face 104 is transparent for the radiation emitted by the optoelectronic semiconductor chip 10, and the radiation emitted by the optoelectronic semiconductor chip 10 can emerge from the optoelectronic component 300 through the exit face 104.

The exit face 104 in the housing cover 312 is oriented essentially perpendicularly to the bearing face 316. The recess 314 in the housing cover 312 extends from the lower side 317 comprising the bearing face 316 to the upper side 318, located opposite the lower side 317, of the housing cover 312. As an alternative, the recess 314 may also extend only over a part of the height of the housing cover 312 starting from the lower side 317 or the upper side 318. The housing cover 312 is arranged on the housing bottom 320 of the optoelectronic component 300 such that the recess 314 with the exit face 104 merges into the bottom recess 125 in the housing bottom 320.

The housing bottom 320 of the optoelectronic component 300 is formed as a circuit board comprising through-contacts. The circuit board may, for example, comprise a glass fiber-reinforced plastic material, a ceramic material or a plastic material. As an alternative, the housing bottom 320 may also be configured as an injection-molded circuit carrier (molded interconnect device, MID). The housing bottom 320 of the optoelectronic component 300 may also be configured like the housing bottom 120 of the optoelectronic component 1. In particular, the housing bottom 320 may comprise a lead frame around which an insulating material is molded.

During production of the optoelectronic component 300, the housing cover 312 is produced by a molding method from a transparent molding compound before arrangement on the housing bottom 320. The molding method may, for example, be a compression-molding method or an injection-molding method. In the molding method, a molding tool defining the recess 314 and the exit face 104 is used to form the exit face 104 and the recess 314 in the housing cover 312. The molding tool may, for example, be part of a casting or compression mold.

In a similar way to the molding tool described in connection with FIG. 3, the molding tool comprises parts defining the recess 314 and the exit face 104. In addition, the molding tool comprises parts defining the cavity 313 in the housing cover 312.

In a similar way to the housing bodies 110 of the optoelectronic component 1, the housing cover 312 may be manufactured in a housing part assembly comprising further housing covers besides the housing cover 312. The housing part assembly is then formed from the transparent molding compound by using the molding tool defining the exit face 104, and comprises a plurality of housing covers 312 connected to one another with material uniformity.

The housing part assembly is molded from the transparent molding compound such that it comprises the housing covers 312 of a plurality of optoelectronic components 300, and the housing covers 312, in a similar way to the arrangement of the housing bodies 110 in FIG. 3, are arranged in grid form in the housing part assembly. The housing cover 312 of the housing part assembly are formed continuously from the transparent molding compound so that housing covers 312 respectively adjacent to one another are connected to one another with material uniformity. A suitable molding tool may have a part, defining the bearing faces 316 in which elevations defining the cavities 313 of the housing covers 312 are formed. The elevations in this case lie in grid form next to one another.

In a similar way to the molding, described in connection with FIG. 3, of the exit faces 104 of the optoelectronic components 1, 2, the housing covers 312 in the housing part assembly are molded from the transparent molding compound such that the recesses 314 of respectively two of the housing covers 312 are adjacent to one another and together form a recess in the housing part assembly. To this end, in a similar way to the molding tool 210, the molding tool used to mold the housing part assembly with the housing covers 312 comprises a part defining the recess 202 formed together by the recesses 314 and on which, respectively opposing one another, in each case a part, defining the exit faces 104, of the molding tool is arranged.

Besides the parts defining the recesses 314 with the exit faces 104 and, and the parts defining the cavities 313, the molding tool has faces forming the bearing faces 316 and the upper sides 318 of the housing covers 312. In this case, the molding tool may be configured in two parts, a first part comprising the faces defining the bearing face 316 and the parts defining the cavities, and a second part having the faces defining the upper sides 318. The parts defining the recesses 314 with the exit faces 104 may be formed either entirely on the first or second part of the molding tool, or partially on the first part and partially on the second part.

To produce the individual housing covers 312, in a similar way to the housing part assembly 200 with the housing bodies 110, the housing part assembly with the housing covers 312 is separated such that the outer wall faces 311 are formed along separating planes 205 and the recess 202, formed from respectively two of the recesses 314, of the housing part assembly is separated. The separation of the recess 202 may, for example, be carried out centrally.

Production of the housing covers 312 in the housing part assembly and the subsequent division of the housing covers 312 by separation of the housing part assembly have the effect that the outer wall face 311 has separating marks resulting from the separating method, but the exit face 104 arranged in the recess 314 is free of these separating marks. If the housing part assembly is separated by sawing or breaking, the outer wall face 311 may, for example, have a greater surface roughness than the exit face 104 because of the separating marks.

In the optoelectronic component 300, the arrangement of the housing cover 312 on the housing bottom 320 may, for example, be carried out after the housing cover 312 has been divided during separation of the housing part assembly. In this case, application of the housing cover 312 to the housing bottom 320 may be carried out in a similar way as the application of the optoelectronic semiconductor chip 10 to the housing bottom 320. As an alternative, the housing part assembly with the housing cover 312 may initially be arranged on a further housing part assembly comprising the housing bottom 320, and the housing part assemblies with the housing covers and the housing bottoms may subsequently be separated together. After arrangement on the housing bottom 320, the housing cover 312 may be fastened on the housing bottom 320, for example, it may be fixed by adhesive bonding or fixed by soldering.

In an alternative production method of the optoelectronic component 320, the housing cover 312 may also be formed individually from the transparent molding compound by the molding method. In this case, a molding tool also comprising parts defining the side faces 319, besides the parts defining the exit face 104 and the cavity 313, may be used. In particular, the molding tool may have a part defining the outer wall face 311.

In a housing cover 312 produced in such a way, the side faces 319 of the housing cover 312 may be formed with an angle greater or less than 90° relative to the bearing face 316. For example, the housing cover 312 formed in the molding tool may have mold release slopes on the side faces 319, in order to be able to remove the housing cover 312 from the molding tool more easily. For example, the housing cover 312 may taper on the outer side from the bearing face 316 in the direction of the upper side, located opposite the bearing face 316, of the housing cover 312.

In particular, the outer wall face 311 may be formed with a mold release slope and consequently not be oriented perpendicularly to the bearing face 316. The effect of this is that, after arrangement of the housing cover 312 on the housing bottom 320, the outer wall face 311 is not perpendicular to the upper side 122 of the housing bottom 320, or to the emission direction 12 of the emitted electromagnetic radiation 14. In this case, formation of the exit face 104 in the recess 314 makes it possible to form the exit face 104 without such a mold release slope, i.e., oriented perpendicularly relative to the bearing face 316.

In a similar way thereto, the outer wall face 106 of the optoelectronic component 1 with the housing body 110 may also have a mold release slope, and consequently not be oriented perpendicularly to the upper side 122 of the housing bottom 120, or the emission direction 12 of the emitted radiation 14. As a result of the exit face 104 being formed in the recess 102 from the encapsulation compound 140 in the optoelectronic component 1, the exit face 104 may be formed perpendicularly to the emission direction 12 even when the outer wall face 106 has a mold release slope.

If the exit face 104 cannot be formed entirely without mold release slopes in the optoelectronic components 1, 300, then arrangement of the exit faces 104 in the recesses 102, 314 makes it possible to configure the exit faces 104 with a lesser mold release slope than the outer wall faces 106, 311.

Figure 6:
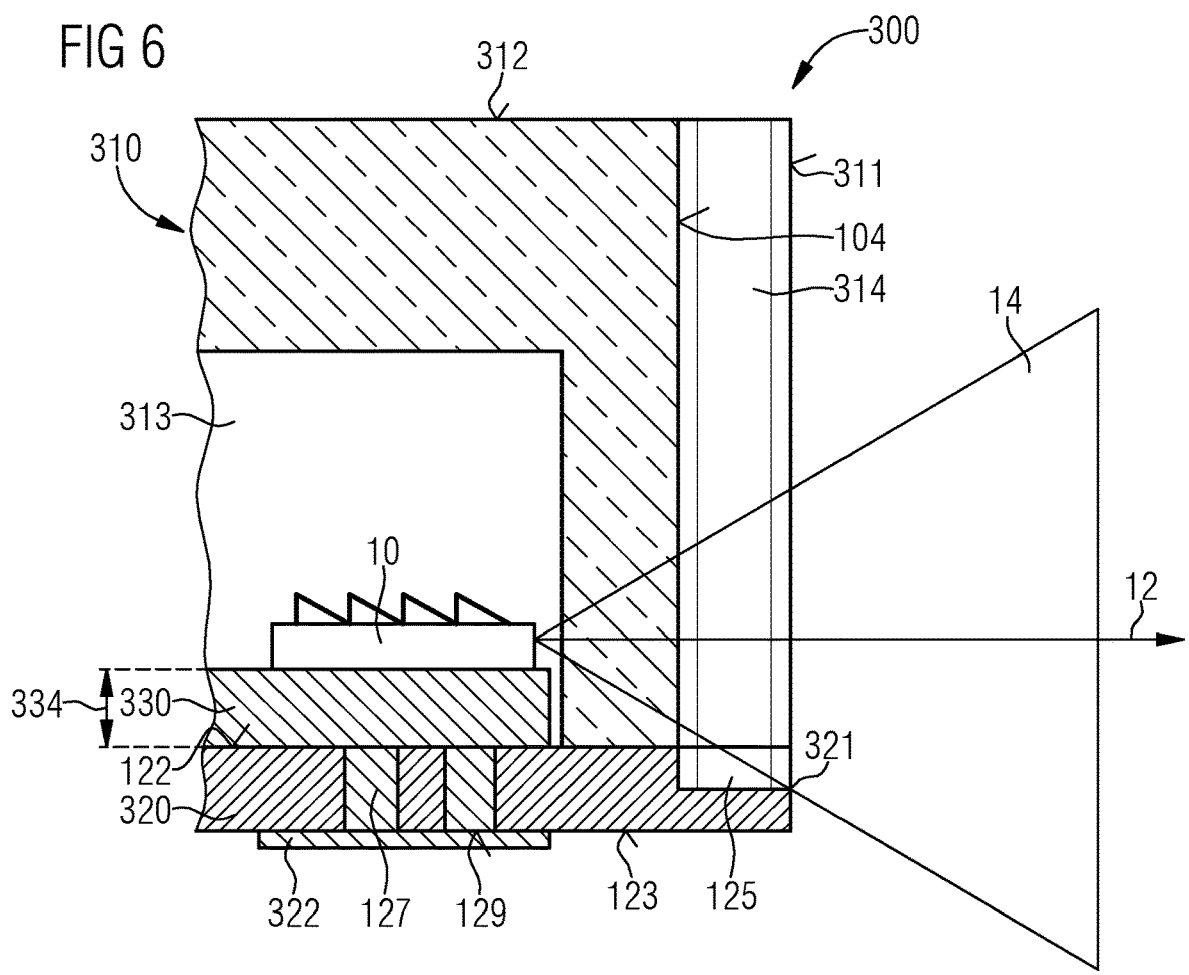
FIG. 6 shows a schematic sectional side view of the further optoelectronic component.

FIG. 6 shows a sectional side view of the optoelectronic component 300 transversely to the emission direction 12. The exit face 104 on the housing cover 312 is oriented essentially perpendicularly to the emission direction 12 of the emitted radiation 14. The distance of the optoelectronic semiconductor chip 10 from the exit face 104 and the offset of the exit face 104 relative to the outer wall face 311, or the depth of the recess 314, corresponds to the relevant dimensions of the optoelectronic component 1.

Like the optoelectronic component 1, the optoelectronic component 300 has a contact element 127 connecting the lower side 123 and the upper side 122 of the housing bottom 320. In the optoelectronic component 300, the contact element 127 is configured as a through-contact of the conductive track substrate forming the housing bottom 320.

On the lower side 123 of the housing bottom 120, the contact element 127 contacts a solder contact 322 applied onto the lower side 123 of the housing bottom 120. For example, the solder contact 322 may be configured as a metallization layer applied onto the lower side 123. Instead of the solder contact 122, the optoelectronic component 300 may also have a different contact means, for example, an adhesive contact. The optoelectronic component 300 may, like the optoelectronic component 1, for example, be configured as a QFN component with contact means arranged on the lower side 123 of the housing bottom 320.

In the optoelectronic component 300, the optoelectronic semiconductor chip 10 is arranged on a base 130 above the upper side 122 of the housing bottom 120. The base 330 is in this case arranged on the upper side 122 of the housing bottom 120.

The base 330 has, in a direction perpendicular to the upper side 122, a height 334 which is dimensioned such that the electromagnetic radiation 14 emerging divergently from the optoelectronic semiconductor chip 10 is not shadowed by the housing bottom 120. In particular, the emitted radiation 14 is not shadowed at a front edge 321, adjacent to the outer wall face 311, of the housing bottom 320. The spacing required for this between the front edge 321 and the optoelectronic semiconductor chip 10 perpendicularly to the upper side 122 of the housing bottom 320 is determined, for a given divergence of the emitted radiation 14, from the distance at which the optoelectronic semiconductor chip 10 is arranged away from the outer wall face 311 inside the optoelectronic component 300.

By virtue of the elevated arrangement of the optoelectronic semiconductor chip 10 on the base 330 and the lowering of the front edge 321 by formation of the bottom recess 125, the optoelectronic semiconductor chip 10 can be arranged far enough away from the front edge 321 that a part of the housing cover 312 can be arranged between the front edge 321 and the optoelectronic semiconductor chip 10.

The height 334 of the base 330 is at least 20 µm, and may be up to 400 µm. In particular, the height 334 may be 100 µm to 300 µm. The height 334 may, for example, be 150 µm.

In the optoelectronic component 300, the base 330 is configured as a metallization layer applied onto the upper side 122 of the housing bottom 320. In other examples of the optoelectronic component 300, the base 330 may also, for example, be configured as a sub mount of the optoelectronic semiconductor chip 10. If the housing bottom 320, like the housing bottom 120 of the optoelectronic component 1, comprises the lead frame 126, the base 330 may also be configured as an elevated part of the lead frame 126.

The arrangement, described in connection with the optoelectronic component 300, of the optoelectronic semiconductor chip 10 on the base 330 may be carried out in a similar way as in the optoelectronic component 1 comprising the housing body 110. In this way, in the optoelectronic component 1 as well, the optoelectronic semiconductor chip 10 can be arranged far enough away from the outer wall face 106 inside the housing 100 that the part of the housing 100, which is located between the recess 102 and the optoelectronic semiconductor chip 10, has a thickness required for the stability of the housing 100. In the optoelectronic component 1, this part of the housing 100 is formed from the encapsulation compound 140.

Both the optoelectronic component 1 and the optoelectronic component 300 may have either the base 330 or the bottom recess 125, or may comprise both the base 330 and the bottom recess 125, as is represented for the optoelectronic component 300 in FIG. 6.

Although our components and methods have in detail been illustrated and described in detail by the preferred examples, this disclosure is not restricted to the examples disclosed, and other variants may be derived therefrom by those skilled in the art, without departing from the protective scope of the appended claims.

This application claims priority of DE 10 2015 115 824.8, the subject matter of which is incorporated herein by reference.

The invention claimed is:

1. An optoelectronic component comprising an optoelectronic semiconductor chip that emits electromagnetic radiation, arranged in a housing,
   wherein the housing has an outer wall face and an exit face transparent to the electromagnetic radiation,
   the exit face is set back relative to the outer wall face in a direction of an interior of the housing,
   the optoelectronic semiconductor chip is arranged such that radiation emitted by the optoelectronic semiconductor chip in an emission direction can emerge from the optoelectronic component through the exit face, and
   the outer wall face has separating marks and the exit face is free of separating marks.

2. The optoelectronic component as claimed in claim 1, wherein the exit face is oriented perpendicularly to the emission direction.

3. The optoelectronic component as claimed in claim 1, wherein the optoelectronic semiconductor chip is arranged above an upper side of a housing bottom of the housing.

4. The optoelectronic component as claimed in claim 3, wherein the emission direction is oriented parallel to the upper side of the housing bottom.

5. The optoelectronic component as claimed in claim 3,
   wherein the upper side of the housing bottom has a bottom recess in the region of the exit face, and
   the bottom recess is located between the optoelectronic semiconductor chip and the outer wall face.

6. The optoelectronic component as claimed in claim 3, wherein the optoelectronic semiconductor chip is arranged on a base arranged on the upper side.

7. The optoelectronic component as claimed in claim 6, wherein the base is formed by a metallization layer applied onto the upper side, and the metallization layer has a height, oriented perpendicularly to the upper side of at least 20 μm.

8. The optoelectronic component as claimed in claim 3,
wherein the housing comprises a housing body having the housing bottom, and an encapsulation compound,
a cavity adjacent to the upper side of the housing bottom is formed in the housing body,
the housing body comprises at least a part of the outer wall face,
the cavity is at least partially encapsulated with the encapsulation compound, and
the exit face is formed from the encapsulation compound.

9. The optoelectronic component as claimed in claim 8,
wherein the housing body has an opening in which the exit face is arranged, and
the opening is at least partially encapsulated with the encapsulation compound.

10. The optoelectronic component as claimed in claim 8, wherein a part of the outer wall face is formed from the encapsulation compound.

11. The optoelectronic component as claimed in claim 8,
wherein the housing bottom comprises a contact element having a chip contact pad and a bottom contact pad,
the chip contact pad and the bottom contact pad conductively connect to one another,
the contact element extends from the upper side of the housing bottom to a lower side, located opposite the upper side, of the housing bottom, and
the chip contact pad forms a part of the upper side of the housing bottom, and the bottom contact pad forms a part of the lower side of the housing bottom.

12. The optoelectronic component as claimed in claim 3,
wherein the housing comprises a housing cover transparent to the radiation and arranged on the housing bottom,
the outer wall face and the exit face are formed at least partially on the housing cover, and
the housing cover is arranged on the housing bottom.

13. The optoelectronic component as claimed in claim 12, wherein the housing bottom comprises a circuit board or a ceramic substrate.

14. A method of producing an optoelectronic component having a housing, which has an outer wall face and an exit face, which is transparent to electromagnetic radiation emitted by an optoelectronic semiconductor chip arranged in the housing, wherein the exit face is set back relative to the outer wall face in a direction of the interior of the housing,
the method comprising molding the exit face from a molding compound transparent to the radiation, in a housing part assembly by using a molding tool defining the exit face, and
forming the outer wall face by separating the housing part assembly.

15. The method as claimed in claim 14,
wherein the exit face is formed in a recess, defined by the molding tool, of the housing part assembly, and
the recess is separated during separation of the housing part assembly.

16. The method as claimed in claim 14, further comprising:
providing the housing part assembly comprising a housing body of the housing with a cavity intended to receive the optoelectronic semiconductor chip,
arranging the molding tool on the cavity, and
filling the cavity with the transparent molding compound.

17. The method as claimed in claim 16, wherein a part, defining the exit face, of the molding tool is arranged in an opening of the housing body.

18. The method as claimed in claim 14,
wherein, together with the exit face, the housing part assembly comprising a housing cover of the housing is molded from the transparent molding compound, and
the method further comprising arranging the housing cover on a housing bottom of the housing.

* * * * *